United States Patent
Takeyama et al.

(10) Patent No.: US 10,333,486 B2
(45) Date of Patent: Jun. 25, 2019

(54) PIEZOELECTRIC VIBRATOR AND PIEZOELECTRIC VIBRATING APPARATUS

(71) Applicant: Murata Manufacturing Co., Ltd., Nagaokakyo-shi, Kyoto-fu (JP)

(72) Inventors: Keisuke Takeyama, Nagaokakyo (JP); Daisuke Nakamura, Nagaokakyo (JP); Eitaro Kameda, Nagaokakyo (JP); Hiroaki Kaida, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 476 days.

(21) Appl. No.: 15/206,647

(22) Filed: Jul. 11, 2016

(65) Prior Publication Data
US 2016/0322953 A1 Nov. 3, 2016

Related U.S. Application Data

(63) Continuation of application No. PCT/JP2015/050991, filed on Jan. 15, 2015.

(30) Foreign Application Priority Data

Jan. 17, 2014 (JP) .................................. 2014-007088
Sep. 10, 2014 (JP) .................................. 2014-184557

(51) Int. Cl.
*H03H 9/17* (2006.01)
*H03H 9/02* (2006.01)
(Continued)

(52) U.S. Cl.
CPC ...... *H03H 9/02244* (2013.01); *H03H 3/0077* (2013.01); *H03H 3/02* (2013.01);
(Continued)

(58) Field of Classification Search
CPC .. H03H 9/02244; H03H 9/17; H03H 9/02047; H03H 9/02; H03H 9/02157; H03H 9/02173; H03H 9/02165
See application file for complete search history.

(56) References Cited

U.S. PATENT DOCUMENTS 6,271,619 B1   8/2001  Yamada et al.
7,019,604 B2   3/2006  Gotoh et al.
(Continued)

FOREIGN PATENT DOCUMENTS

EP   2530836 A1    12/2012
JP   H08186467 A    7/1996
(Continued)

OTHER PUBLICATIONS

International Search Report issued for PCT/JP2015/050991, dated Apr. 7, 2015.
(Continued)

*Primary Examiner* — J. San Martin
(74) *Attorney, Agent, or Firm* — Arent Fox LLP

(57) ABSTRACT

A piezoelectric vibrator that includes a piezoelectric film with a pair of electrodes disposed on opposing sides of the piezoelectric film. Moreover, the vibrator includes first and second adjustment films with the first adjustment film covering the first surface of the piezoelectric film in a first region and the second adjustment film covering the first surface of the piezoelectric film in a second region that is different from the first region. Moreover, the second region of the piezoelectric film has a greater displacement than the first region when the piezoelectric vibrator vibrates.

20 Claims, 13 Drawing Sheets

(51) Int. Cl.
*H03H 9/05* (2006.01)
*H03H 3/007* (2006.01)
*H03H 3/02* (2006.01)
*H03H 3/04* (2006.01)
*H03H 9/15* (2006.01)

(52) U.S. Cl.
CPC ............ *H03H 3/04* (2013.01); *H03H 9/0504* (2013.01); *H03H 9/17* (2013.01); *H03H 9/171* (2013.01); *H03H 2003/027* (2013.01); *H03H 2003/0442* (2013.01); *H03H 2009/02173* (2013.01); *H03H 2009/155* (2013.01)

(56) References Cited

U.S. PATENT DOCUMENTS

| | | | |
|---|---|---|---|
| 8,410,868 B2 | 4/2013 | Juergen et al. | |
| 2004/0017269 A1 | 1/2004 | Gotoh et al. | |
| 2012/0305542 A1 | 12/2012 | Donnay et al. | |
| 2013/0038405 A1* | 2/2013 | Taniguchi | H03H 9/02157 333/133 |
| 2013/0285676 A1* | 10/2013 | Rahafrooz | H03H 3/0072 324/633 |
| 2014/0078870 A1* | 3/2014 | Kobayashi | H03H 9/1021 368/47 |
| 2014/0192628 A1* | 7/2014 | Tamura | H03H 9/02157 368/159 |
| 2016/0052018 A1* | 2/2016 | Park | H01L 41/053 310/320 |
| 2018/0019726 A1* | 1/2018 | Han | H03H 9/1014 |
| 2018/0138888 A1* | 5/2018 | Yoon | H03H 9/02118 |

FOREIGN PATENT DOCUMENTS

| | | | |
|---|---|---|---|
| JP | 2004112757 A | 4/2004 | |
| JP | 2005151353 A | 6/2005 | |
| JP | 2009094560 A | 4/2009 | |
| JP | 2011155363 A | 8/2011 | |
| JP | 2012065293 A | 3/2012 | |
| JP | 4930381 B2 | 5/2012 | |
| JP | 2012257246 A | 12/2012 | |
| WO | WO 2007088696 A1 | 8/2007 | |
| WO | WO 2008084578 A1 | 7/2008 | |

OTHER PUBLICATIONS

Written Opinion of the International Searching Authority issued for PCT/JP2015/050991, dated Apr. 7, 2015.

International Search Report issued for PCT/JP2015/050990, dated Mar. 3, 2015.

Written Opinion of the International Searching Authority issued for PCT/JP2015/050990, dated Mar. 3, 2015.

* cited by examiner

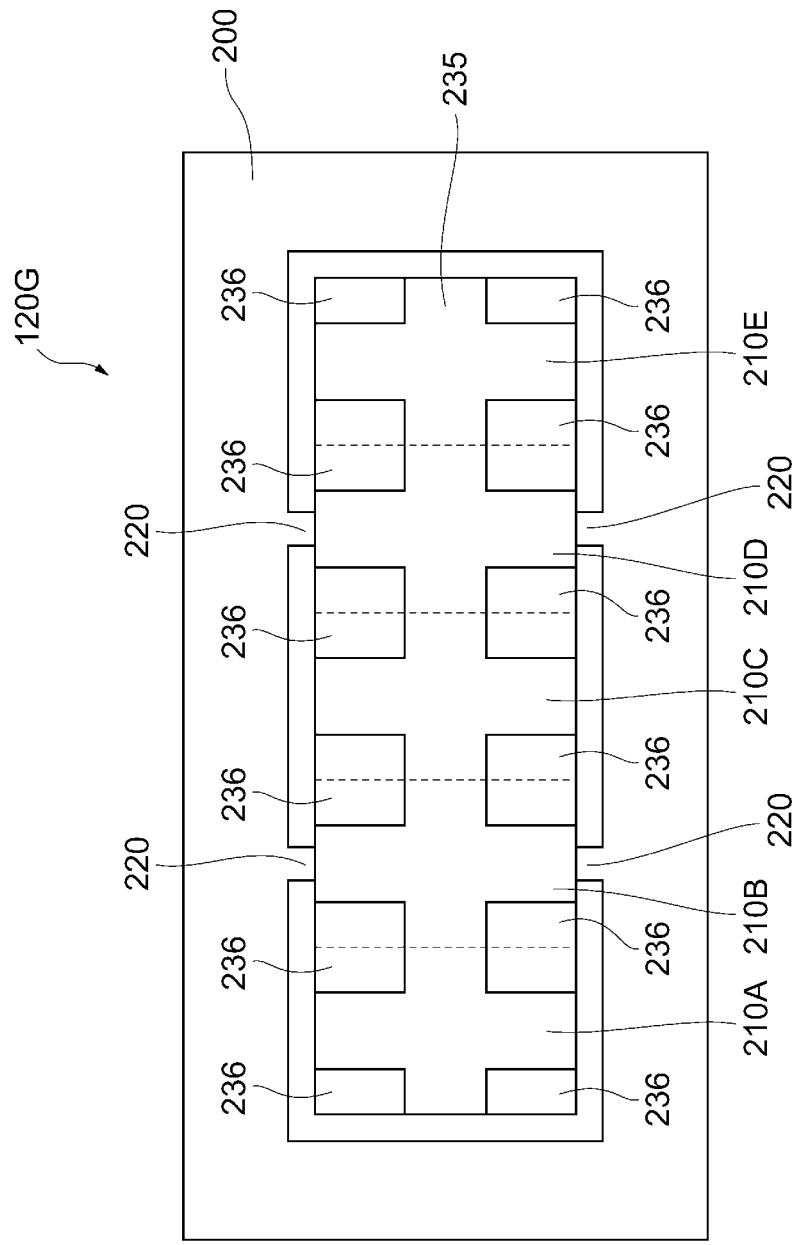

PIEZOELECTRIC VIBRATOR AND PIEZOELECTRIC VIBRATING APPARATUS

CROSS REFERENCE TO RELATED APPLICATIONS

The present application is a continuation of PCT/JP2015/050991 filed Jan. 15, 2015, which claims priority to Japanese Patent Application No. 2014-007088, filed Jan. 17, 2014, and Japanese Patent Application No. 2014-184557, filed Sep. 10, 2014, the entire contents of each of which are incorporated herein by reference.

FIELD OF THE INVENTION

The present disclosure relates to a piezoelectric vibrator and a piezoelectric vibrating apparatus.

BACKGROUND

Piezoelectric vibrator can be used devices for implementing a timer function in electronic devices. As electronic devices are made smaller, there is demand for piezoelectric vibrators to be made smaller as well, and piezoelectric vibrators manufactured using MEMS (Micro Electro Mechanical Systems) technology (called "MEMS vibrators" hereinafter) are garnering attention.

In MEMS vibrators, there are cases where variations in resonant frequencies arise due to manufacturing variations. Additional etching or the like is therefore carried out during or after the manufacture of the MEMS vibrator in order to adjust the frequency thereof.

For example, Patent Document 1 discloses a configuration that adjusts a resonant frequency by forming an additional film constituted of a single material on an electrode of a piezoelectric vibrator and then causing the thickness of the additional film in a first region to differ from the thickness of the additional film in a second region.

Additionally, for example, Patent Document 2 discloses a configuration that adjusts a resonant frequency in a vibrator having a plurality of vibrating arms by reducing rough adjustment mass parts provided on tip sides of the vibrating arms and reducing fine adjustment mass parts provided on base end sides of the vibrating arms.

Patent Document 1: Japanese Patent No. 4930381 specification.

Patent Document 2: Japanese Unexamined Patent Application Publication No. 2012-065293.

As described above, according to the configuration disclosed in Patent Document 1, the additional film for adjusting the resonant frequency is formed from a single material. To achieve different thicknesses in the additional film from region to region, it is therefore necessary to carry out an adjustment operation, such as irradiation with a beam, on each region, which is inefficient.

According to the configuration disclosed in Patent Document 2 as well, it is necessary to remove the rough adjustment mass parts provided on the tip sides of the vibrating arms and remove the fine adjustment mass parts provided on the base end sides of the vibrating arms individually, which is inefficient.

SUMMARY OF THE INVENTION

Having been achieved in light of such circumstances, it is an object of the present disclosure to enable a resonant frequency to be adjusted efficiently in a piezoelectric vibrator.

A piezoelectric vibrator according to the present disclosure includes a first electrode and a second electrode; a piezoelectric film, formed between the first electrode and the second electrode, having a first surface that opposes the first electrode; and a first adjustment film and a second adjustment film formed opposing the first surface of the piezoelectric film, with the first electrode interposed between the adjustment films and the piezoelectric film. The first adjustment film covers the first surface of the piezoelectric film in at least a first region. The second adjustment film covers the first surface of the piezoelectric film in at least a second region that is different from the first region. Almost the entirety of the first surface is covered by the first and second regions. The second region is a region of greater displacement than the first region when the piezoelectric vibrator vibrates. The second adjustment film is formed from a material having a higher mass reduction rate of etching than the first adjustment film.

According to the present disclosure, a resonant frequency can be adjusted efficiently in a piezoelectric vibrator.

BRIEF DESCRIPTION OF THE DRAWINGS

FIG. 13 is a diagram illustrating the configuration of a piezoelectric vibrator 120G serving as another example of the piezoelectric vibrator 120.

DETAILED DESCRIPTION OF THE EMBODIMENTS

Figure 1:
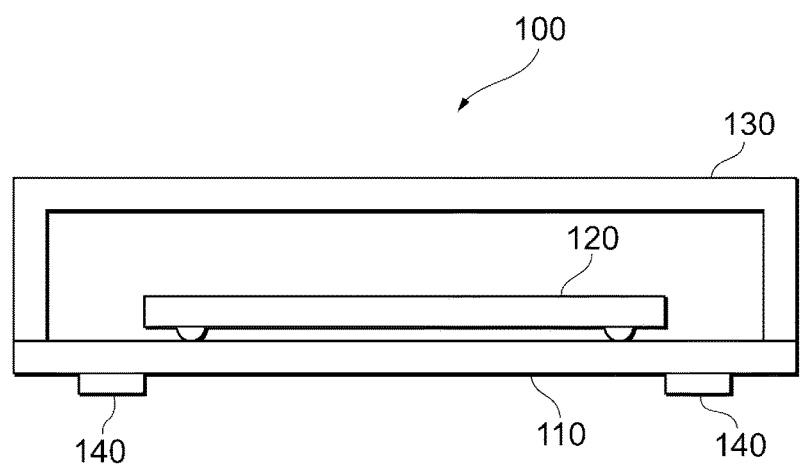
FIG. 1 is a diagram illustrating an example of the overall structure of a piezoelectric vibrating apparatus according to an embodiment.

Hereinafter, exemplary embodiments of the present disclosure will be described with reference to the drawings. FIG. 1 is a diagram illustrating an example of the overall structure of a piezoelectric vibrating apparatus according to an embodiment of the present invention. As illustrated in FIG. 1, a piezoelectric vibrating apparatus 100 is a piezoelectric vibrating apparatus including a substrate 110, a piezoelectric vibrator 120, a cover member 130, and outer electrodes 140. The piezoelectric vibrator 120 is a MEMS vibrator manufactured using MEMS technology. The cover member 130 is formed from silicon, for example, and covers the piezoelectric vibrator 120. The outer electrodes 140 are metal electrodes for electrically connecting a device on the outside of the piezoelectric vibrating apparatus 100 to the piezoelectric vibrator 120.

Figure 2:
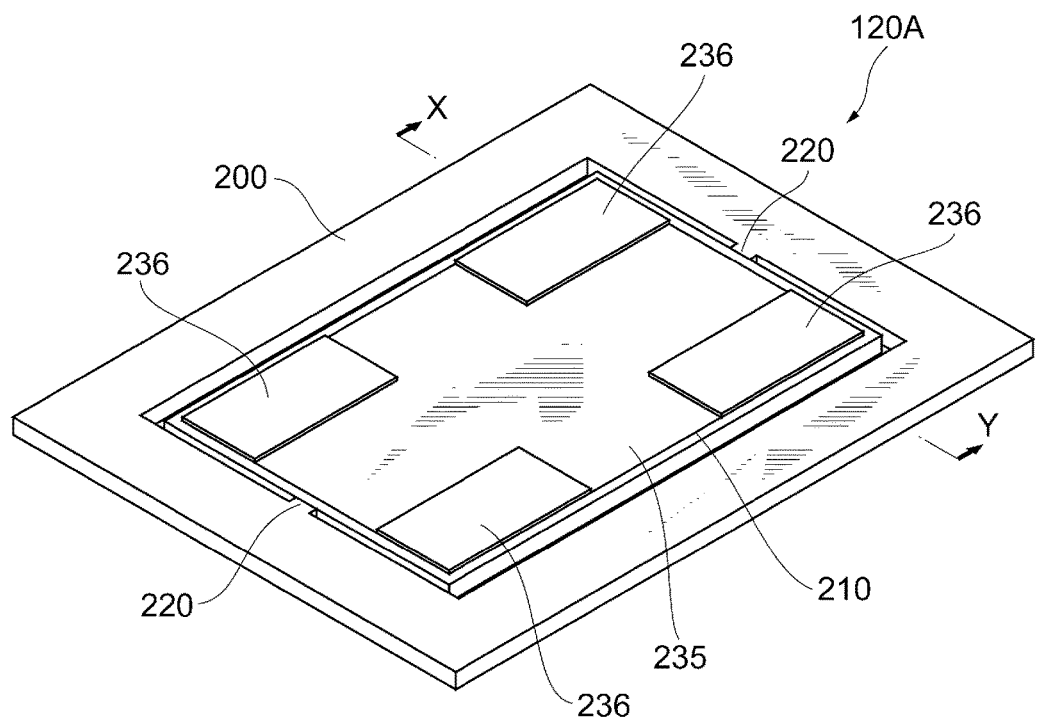
FIG. 2 is a perspective view of a piezoelectric vibrator 120A serving as an example of a piezoelectric vibrator 120.
Figure 3:
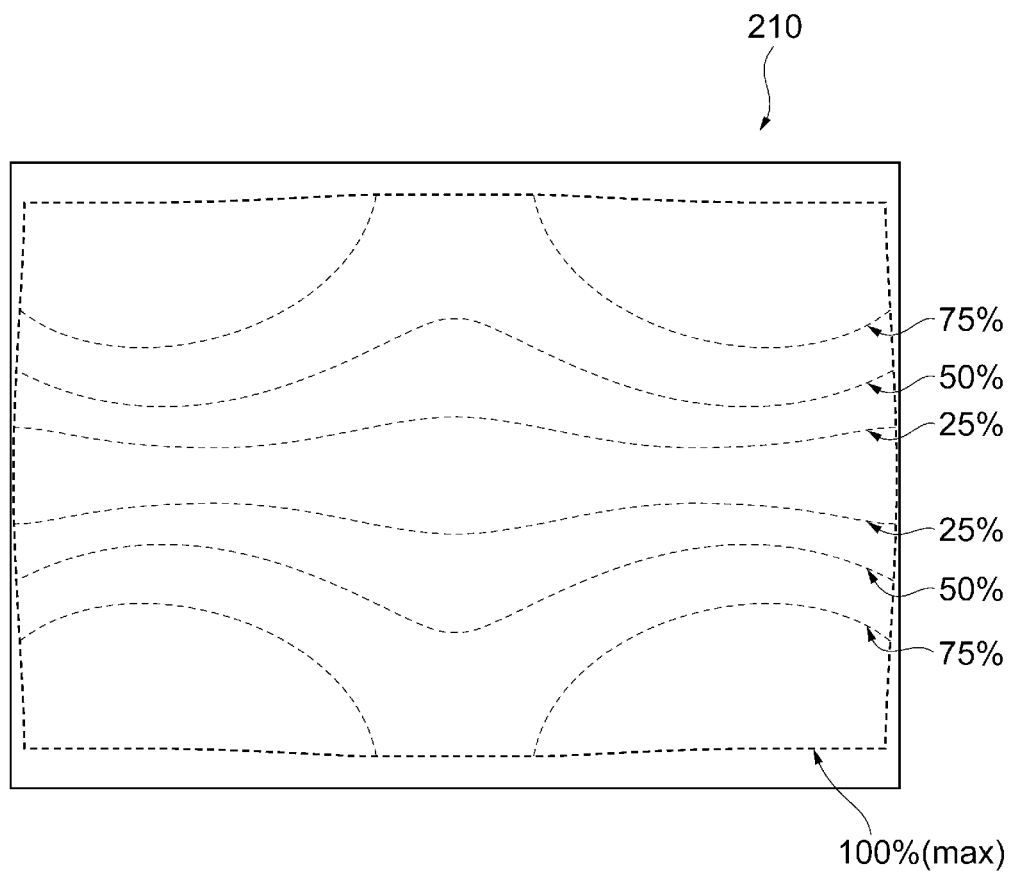
FIG. 3 is a diagram illustrating the magnitude of displacement occurring when the piezoelectric vibrator 120A vibrates.
Figure 4A:
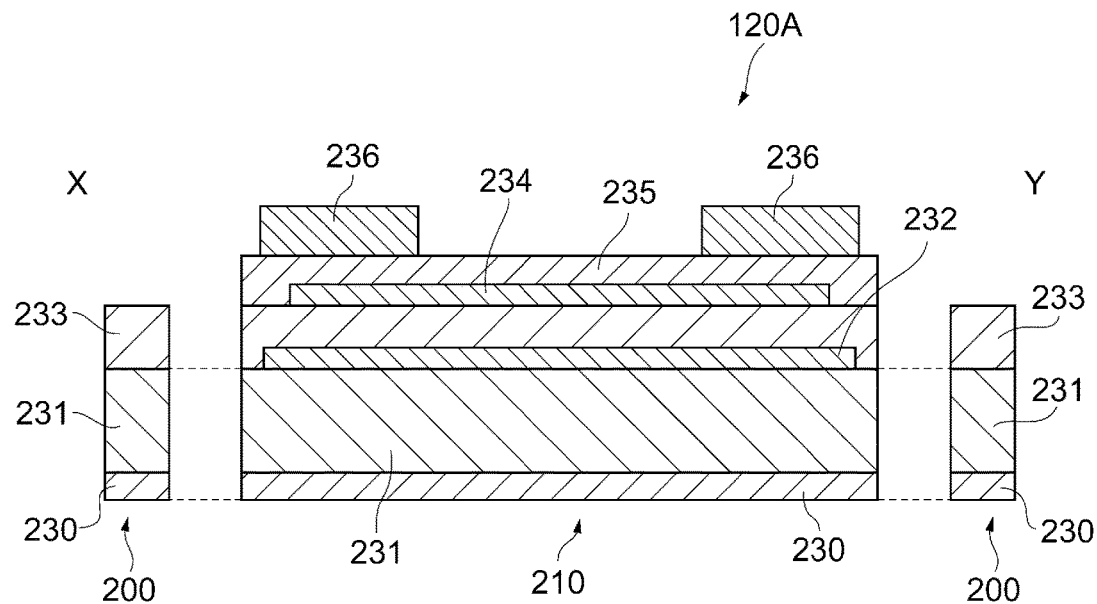
FIG. 4A is a schematic diagram illustrating a cross-section of the piezoelectric vibrator 120A before resonant frequency adjustment, taken along an X-Y line indicated in FIG. 2.
Figure 4B:
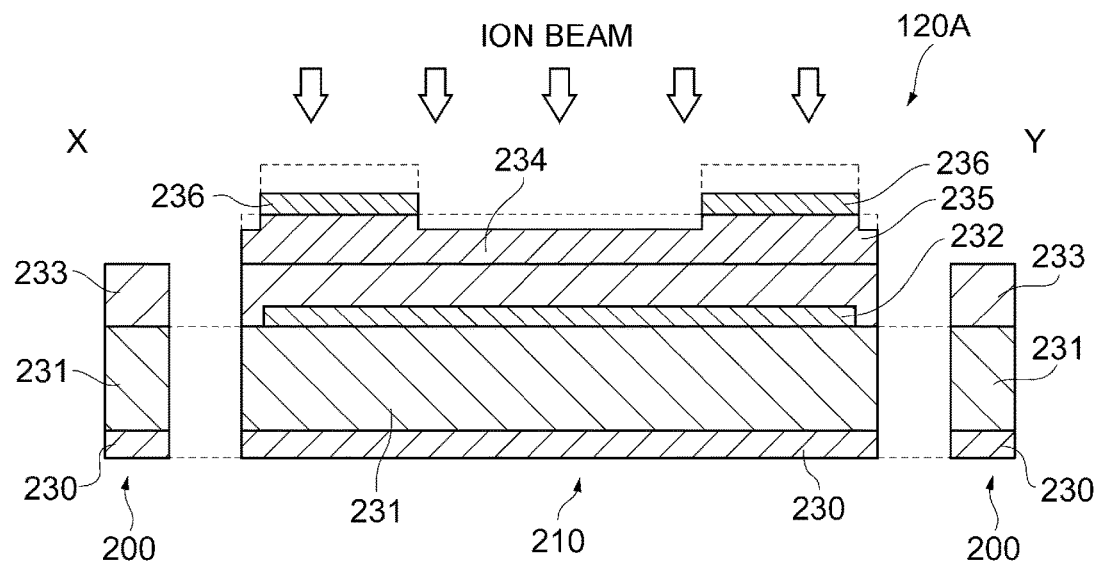
FIG. 4B is a schematic diagram illustrating a cross-section of the piezoelectric vibrator 120A after resonant frequency adjustment, taken along the X-Y line indicated in FIG. 2.

Next, examples of the configuration of the piezoelectric vibrator 120 will be described with reference to FIGS. 2, 3, 4A, and 4B. FIG. 2 is a perspective view of a piezoelectric vibrator 120A serving as an example of the piezoelectric vibrator 120. FIG. 3 is a diagram illustrating the magnitude of displacement occurring when the piezoelectric vibrator 120A vibrates. FIG. 4A is a schematic diagram illustrating a cross-section of the piezoelectric vibrator 120A before resonant frequency adjustment, taken along an X-Y line indicated in FIG. 2. FIG. 4B is a schematic diagram illustrating a cross-section of the piezoelectric vibrator 120A after the resonant frequency adjustment, taken along the X-Y line indicated in FIG. 2.

As illustrated in FIG. 2, the piezoelectric vibrator 120A includes a holding portion 200 and a vibrating portion 210. Preferably, the holding portion 200 and the vibrating portion 210 are formed integrally through a MEMS process including etching. In one embodiment, the vibrating portion 210 is, for example, approximately 100 to 200 μm in both length and width, and approximately 10 μm thick.

The holding portion 200 includes two holding arms 220 that hold the rectangular vibrating portion 210 on opposing sides, for example, as shown. As will be described later, the vibrating portion 210 vibrates with contour vibrations as a result of a piezoelectric film 233 expanding and contracting in planar directions in response to an electric field between an upper electrode 234 and a lower electrode 232. FIG. 3 indicates the magnitude of displacement occurring when the vibrating portion 210 vibrates. Specifically, a percentage (%) of the magnitude of displacement relative to a maximum displacement amount is indicated. As illustrated in FIG. 3, the greatest displacement is in the four corners of the vibrating portion 210, and the displacement decreases toward the central area of the vibrating portion 210.

As illustrated in FIG. 4A, the vibrating portion 210 has a structure in which a silicon oxidant layer 230, a silicon layer 231, the lower electrode 232, the piezoelectric film 233, the upper electrode 234, an adjustment film 235, and an adjustment film 236 are laminated together. The adjustment films 235 and 236 are formed opposing a surface of the piezoelectric film 233 that faces the upper electrode 234 (a first surface).

The silicon oxidant layer 230 is formed from a silicon oxidant such as $SiO_2$, for example. In a certain temperature range, changes in the frequency-temperature characteristics of silicon oxidant are opposite from those of silicon. Accordingly, by forming the silicon oxidant layer 230 on the vibrating portion 210, changes in the frequency characteristics of the silicon layer 231 are cancelled out by changes in the frequency characteristics of the silicon oxidant layer 230, resulting in improved frequency-temperature characteristics.

The silicon layer 231 is formed from silicon. It is noted that the silicon layer 231 can contain phosphorous (P), arsenic (As), antimony (Sb), or the like as an n-type dopant (a donor), for example. The silicon layer 231 may contain a p-type dopant (an acceptor) as well. The silicon layer 231 may be a degenerate semiconductor injected with no less than $1 \times 10^{19}$ $cm^{-3}$ of such a dopant.

The upper electrode 234 and the lower electrode 232 are metal electrodes. Preferably, the upper electrode 234 and the lower electrode 232 are formed using molybdenum (Mo), aluminum (Al), or the like, for example. Note that in the case where the silicon layer 231 is a degenerate semiconductor, the lower electrode 232 may be omitted and the silicon layer 231 may function as a lower electrode.

According to the exemplary embodiment, the piezoelectric film 233 is a piezoelectric thin film that transforms an applied voltage into vibrations. The piezoelectric film 233 can use aluminum nitride, for example, as its primary component. Specifically, the piezoelectric film 233 can be formed from scandium aluminum nitride (ScAlN), for example. ScAlN is obtained by replacing some of the aluminum (Al) in aluminum nitride (AlN) with scandium (Ac). For example, assuming an atomic percentage obtained by adding the number of Al atoms and the number of Sc atoms is 100 at. %, the ScAlN used for the piezoelectric film 233 can be obtained by replacing the Al with Sc so that the Sc is at approximately 40 at. %.

The adjustment film 235 (a first adjustment film) is a film for adjusting the resonant frequency of the piezoelectric vibrator 120A. The adjustment film 235 is formed from a material having a lower mass reduction rate of etching than the adjustment film 236. For example, the adjustment film 235 is formed from a nitride film such as AlN, an oxide film such as $SiO_2$, or the like. Note that the mass reduction rate is expressed as the product of an etching rate (a thickness removed per unit of time) and a density.

The adjustment film 236 (a second adjustment film) is a film for adjusting the resonant frequency of the piezoelectric vibrator 120A. The adjustment film 236 is formed from a material having a higher mass reduction rate of etching than the adjustment film 235. For example, the adjustment film 236 is formed from a metal such as Mo, tungsten (W), gold (Au), platinum (Pt), nickel (Ni), or the like.

It is noted that as long as the relationship between the mass reduction rates is as described above, the etching rates of the adjustment films 235 and 236 may be in any magnitude relationship.

As illustrated in FIGS. 2 and 3, the adjustment film 236 is formed so as to be exposed in regions of the vibrating portion 210 that experiences a comparatively large amount of displacement (a second region). Specifically, the adjustment film 236 is formed so as to be exposed in regions corresponding to the four corners of the vibrating portion 210. Meanwhile, the adjustment film 235 is formed so as to be exposed in other regions (a first region).

It should be understood that it is not necessary for the displacement at all points within the region where the adjustment film 236 is exposed to be greater than the displacement at all points within the region where the adjustment film 235 is exposed. For example, the magnitude of displacement in each region may be determined by an average value of the displacement in each region. Accordingly, the displacement at a given point in the region where the adjustment film 236 is exposed may be lower than the displacement at a given point in the region where the adjustment film 235 is exposed, for example.

As illustrated in FIG. 4B, the adjustment films 235 and 236 are etched by simultaneously irradiating the adjustment film 235 and the adjustment film 236 from above the vibrating portion 210 using an ion beam (an argon (Ar) ion beam, for example). The ion beam can irradiate a range that is broader than the piezoelectric vibrator 120A. Although the present embodiment describes an example of etching using an ion beam, it should be appreciated that the etching method is not limited to using an ion beam.

The primary factors that determine the resonant frequency of the piezoelectric vibrator 120A are mass and a spring constant. Etching the adjustment films 235 and 236 causes a reduction of mass and a drop in the spring constant to occur simultaneously. A reduction in mass causes the resonant frequency to rise, whereas a drop in the spring constant causes the resonant frequency to drop. However, the mass has a relatively greater effect in regions of large displacement, whereas the spring constant has a relatively greater effect in regions of low displacement.

In the piezoelectric vibrator 120A, the adjustment film 236 is formed to be exposed in regions of comparatively large displacement. As described above, the mass reduction rate of the ion beam is higher in the adjustment film 236 than in the adjustment film 235. The mass therefore decreases more quickly in regions of comparatively large displacement, making it possible to raise the resonant frequency. It is noted that although the exposed parts of the adjustment film 235 are also etched at the same time as the adjustment film 236, the mass reduction rate of the adjustment film 235 is lower than that of the adjustment film 236, and thus the spring constant undergoes little change. The effect of a drop in the resonant frequency caused by a change in the spring constant is thus low. Accordingly, in the piezoelectric vibrator 120A, the resonant frequency can be adjusted efficiently by irradiating the adjustment films 235 and 236 with the ion beam simultaneously.

The resonant frequency temperature characteristics are also affected by changes in the spring constant. However, as described above, the spring constant undergoes little change in the piezoelectric vibrator 120A, which makes it possible to reduce changes in the resonant frequency temperature characteristics.

Figure 5:
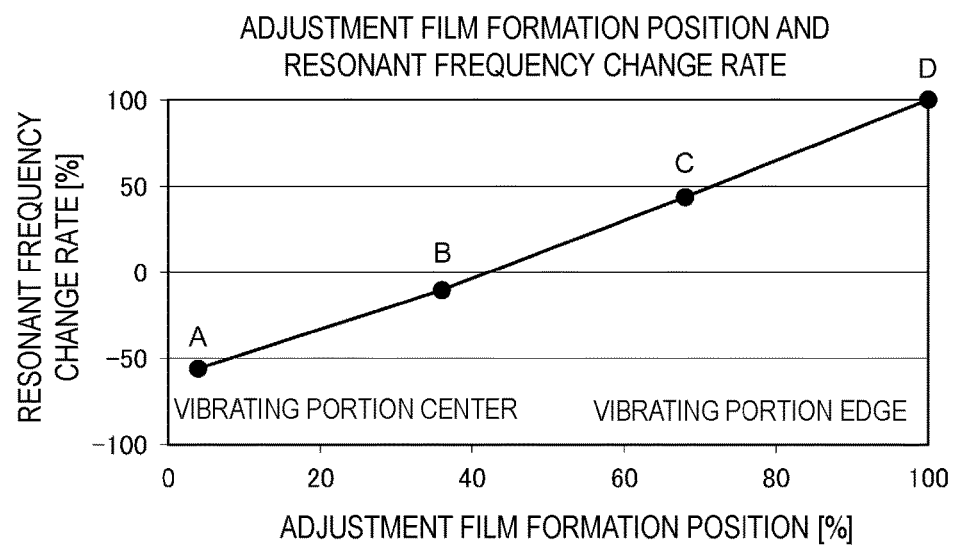
FIG. 5 illustrates simulation results, indicating an example of relationships between a position where an adjustment film 236 is formed and a resonant frequency change rate.

FIG. 5 illustrates simulation results, indicating an example of relationships between a position where the adjustment film 236 is formed and a resonant frequency change rate. It is noted that the simulation results indicated in the present embodiment were obtained in a case where the adjustment film 235 is formed from AlN and the adjustment film 236 is formed from Mo. In FIG. 5, the horizontal axis represents the formation position of the adjustment film 236 and the vertical axis represents the resonant frequency change rate. The formation position of the adjustment film 236 is expressed as a percentage indicating a position relative to a centerline that connects the holding arms 220. The resonant frequency change rate, meanwhile, is a percentage relative to a frequency change amount when the formation position of the adjustment film 236 is 100% (in other words, the case illustrated in FIG. 6B). The shape of the adjustment film 236 is the same regardless of the formation position thereof.

Figure 6A:
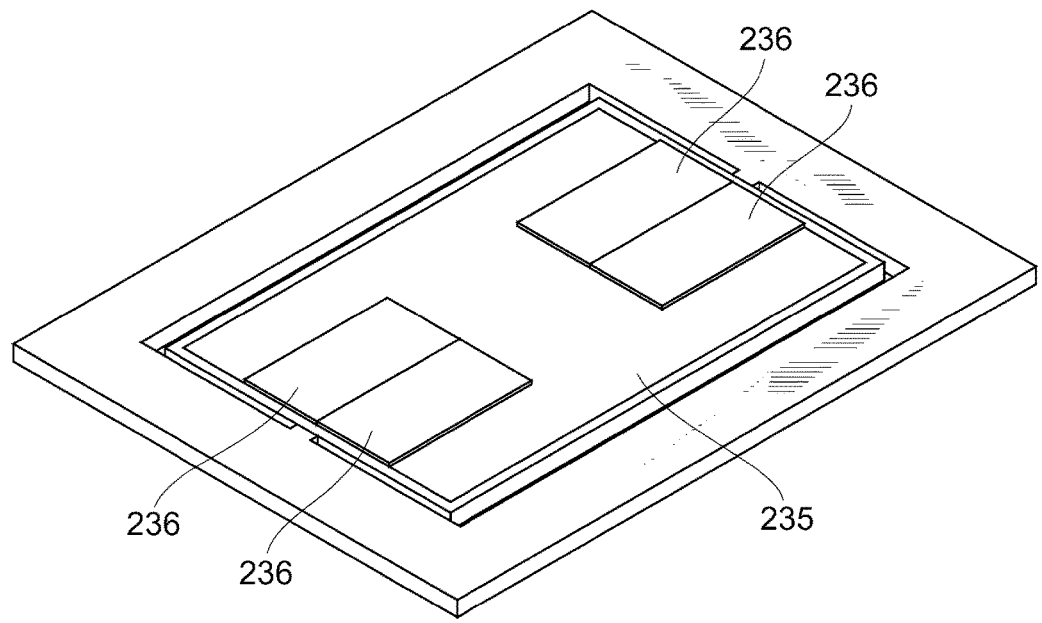
FIG. 6A is a diagram illustrating an example of the formation of the adjustment film 236.

A point A in FIG. 5 indicates a simulation result for a case where the adjustment film 236 is formed in the manner illustrated in FIG. 6A. In this case, the resonant frequency change rate is negative. This is because the displacement in the regions where the adjustment film 236 is exposed is comparatively lower than in other regions, and there is an increased drop in the spring constant caused by the mass reduction of the adjustment film 236.

Figure 6B:
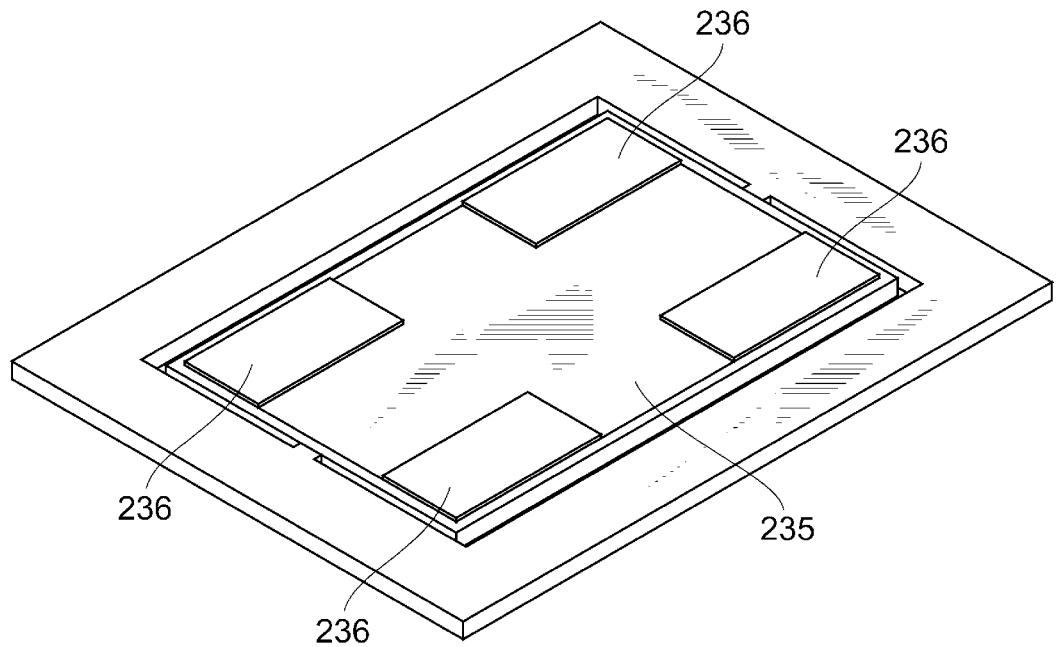
FIG. 6B is a diagram illustrating an example of the formation of the adjustment film 236.

A point D in FIG. 5 indicates a simulation result for a case where the adjustment film 236 is formed in the manner illustrated in FIG. 6B. In this case, the displacement in the regions where the adjustment film 236 is exposed is comparatively larger than in other regions, and there is an increase in the frequency change rate caused by the mass reduction of the adjustment film 236.

As such, it is clear from the simulation results indicated in FIG. 5 as well that forming the adjustment films 235 and 236 so that the displacement is greater in the region where the adjustment film 236 is exposed than in the region where the adjustment film 235 is exposed makes it possible to adjust the resonant frequency of the piezoelectric vibrator 120A efficiently.

Figure 7:
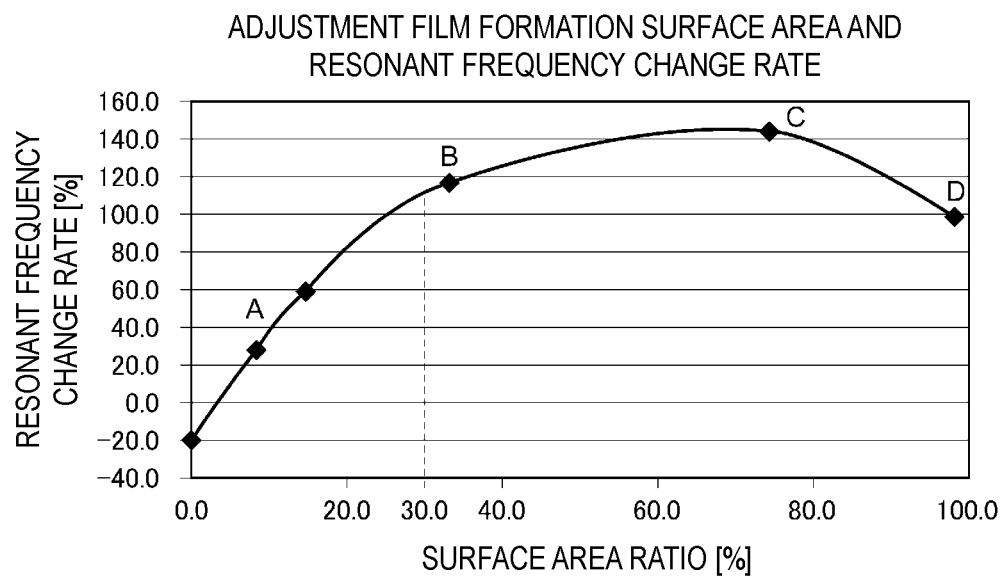
FIG. 7 illustrates simulation results, indicating an example of relationships between a surface area of the adjustment film 236 and a resonant frequency change rate.

FIG. 7 illustrates simulation results, indicating an example of relationships between a surface area (exposed surface area) of the adjustment film 236 and a resonant frequency change rate. As shown in FIG. 7, the horizontal axis represents a surface area ratio of the adjustment film 236 and the vertical axis represents the resonant frequency change rate. It is noted that the surface area ratio of the adjustment film 236 is expressed as a percentage of the surface area (exposed surface area) of the adjustment film 236 relative to the planar area of the surface of the vibrating portion 210. The resonant frequency change rate, meanwhile, is a percentage relative to a frequency change amount when the surface area ratio of the adjustment film 236 is 100% (in other words, the case illustrated in FIG. 8D).

Figure 8A:
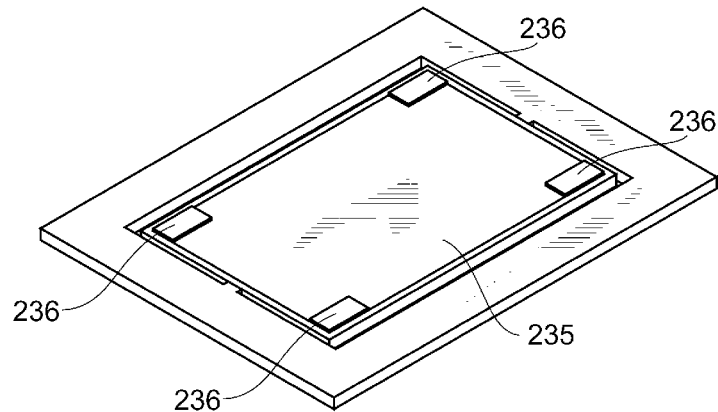
FIG. 8A is a diagram illustrating an example of the formation of the adjustment film 236.
Figure 8B:
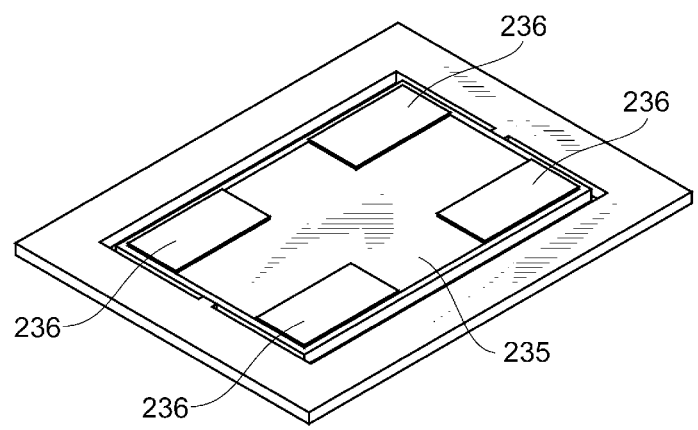
FIG. 8B is a diagram illustrating an example of the formation of the adjustment film 236.
Figure 8C:
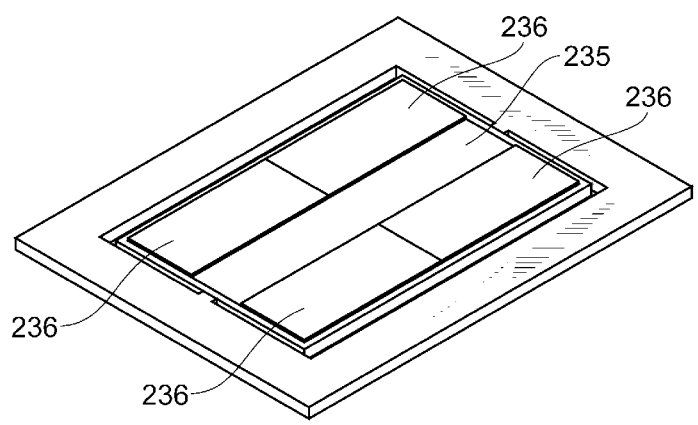
FIG. 8C is a diagram illustrating an example of the formation of the adjustment film 236.
Figure 8D:
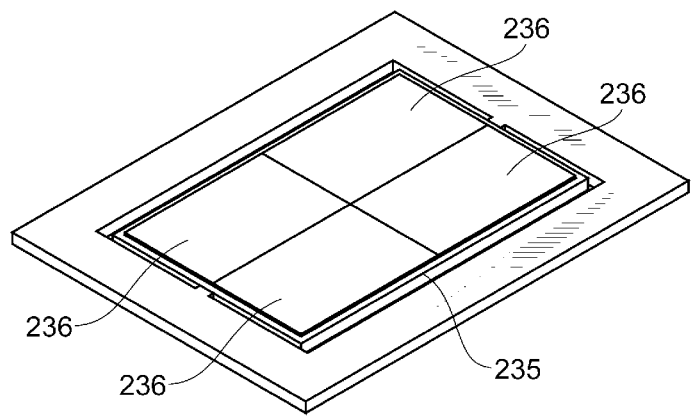
FIG. 8D is a diagram illustrating an example of the formation of the adjustment film 236.

Points A to D in FIG. 7 indicate simulation results for cases where the adjustment film 236 is formed in the manners illustrated in FIGS. 8A to 8D, respectively. As indicated in FIG. 7, setting the surface area ratio of the adjustment film 236 to greater than or equal to approximately 30% makes it possible to increase the frequency change rate more than in the case where the adjustment film 236 is formed across the entire surface as illustrated in FIG. 8D.

Figure 9:
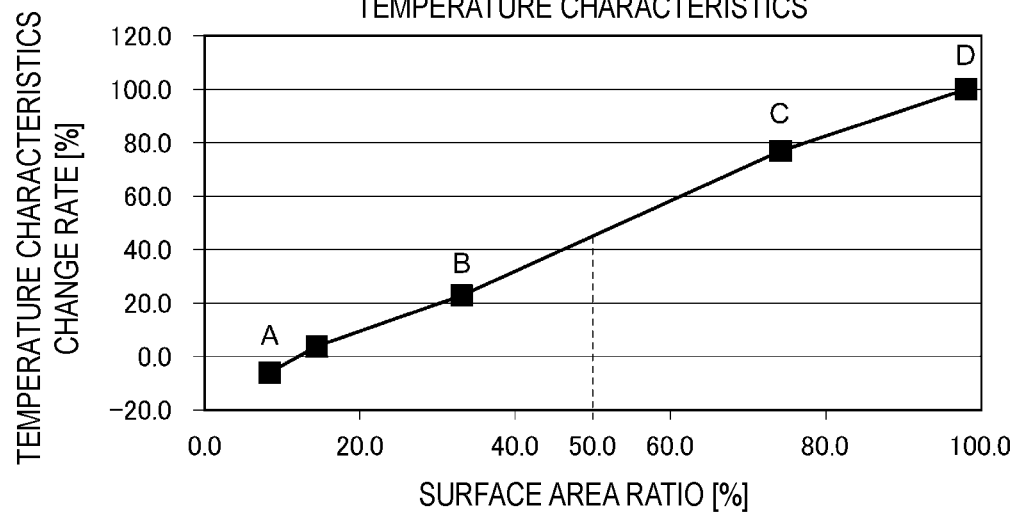
FIG. 9 illustrates simulation results, indicating an example of relationships between a surface area of the adjustment film 236 and a change rate of resonant frequency temperature characteristics.

FIG. 9 illustrates simulation results, indicating an example of relationships between a surface area (exposed surface area) of the adjustment film 236 and a change rate of resonant frequency temperature characteristics. In FIG. 9, the horizontal axis represents the surface area ratio of the adjustment film 236 and the vertical axis represents the change rate of the resonant frequency temperature characteristics (primary coefficient). The surface area ratio of the adjustment film 236 is the same as in FIG. 7. The change rate of the resonant frequency temperature characteristics, meanwhile, is a percentage relative to a primary coefficient of the temperature characteristics when the surface area ratio of the adjustment film 236 is 100% (in other words, the case illustrated in FIG. 8D).

Points A to D in FIG. 9 indicate simulation results for cases where the adjustment film 236 is formed in the manners illustrated in FIGS. 8A to 8D, respectively. As indicated in FIG. 9, setting the surface area ratio of the adjustment film 236 to less than or equal to approximately 50% makes it possible to keep the change rate of the resonant frequency temperature characteristics at 50% or less. Preferably, setting the surface area ratio of the adjustment film 236 to greater than or equal to approximately 10% and less than or equal to approximately 50% makes it possible to suppress the change rate of the resonant frequency temperature characteristics while adjusting the frequency without causing a major drop in the frequency change rate, as compared to a case where the adjustment film 236 is formed across the entire surface as illustrated in FIG. 8D.

According to the simulation results indicated in FIGS. 7 and 9, setting the surface area ratio of the adjustment film 236 to greater than or equal to approximately 30% and less than or equal to approximately 50% makes it possible to adjust the resonant frequency efficiently and suppress a change in the resonant frequency temperature characteristics. Alternatively, setting the surface area ratio of the adjustment film 236 to greater than or equal to approximately 10% and less than or equal to approximately 30% makes it possible to adjust the resonant frequency while keeping a change in the resonant frequency temperature characteristics extremely low. This surface area ratio may be selected as appropriate in accordance with the required piezoelectric vibrator characteristics.

Figure 10:
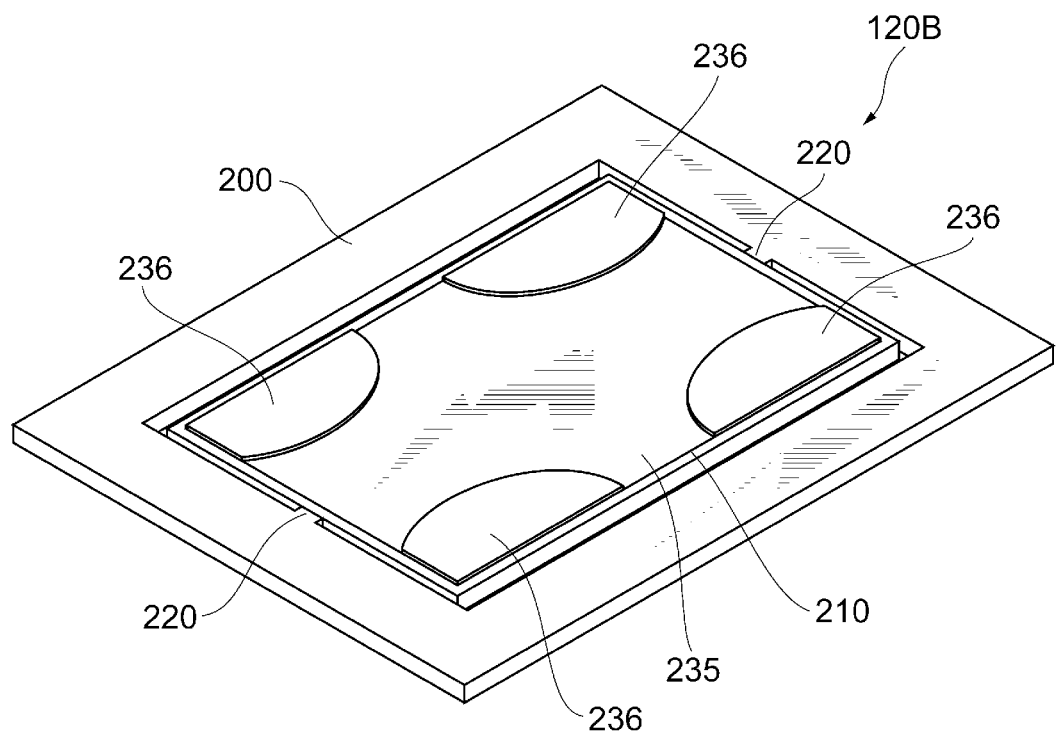
FIG. 10 is a perspective view of a piezoelectric vibrator 120B serving as another example of the piezoelectric vibrator 120.
Figure 11:
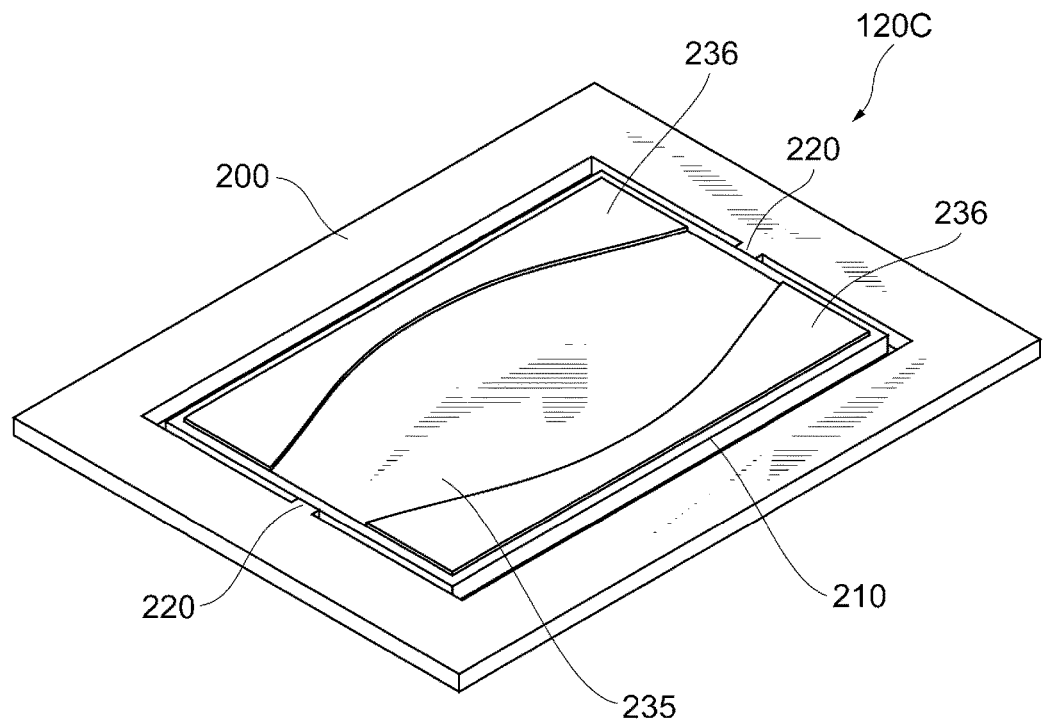
FIG. 11 is a perspective view of a piezoelectric vibrator 120C serving as yet another example of the piezoelectric vibrator 120.

FIG. 10 is a perspective view of a piezoelectric vibrator 120B serving as another example of the piezoelectric vibrator 120. FIG. 11, meanwhile, is a perspective view of a piezoelectric vibrator 120C serving as yet another example of the piezoelectric vibrator 120. Note that the same constituent elements as those in the piezoelectric vibrator 120A will be given the same reference numerals, and descriptions thereof will be omitted. Aside from the shape of the adjustment film 236, the piezoelectric vibrators 120B and 120C have the same configuration as the piezoelectric vibrator 120A. In this manner, the shape of the adjustment film 236 is not limited to the rectangular shape indicated in FIG. 2, and any desired shape can be employed. As illustrated in FIG. 3, the displacement of the vibrating portion 210 changes in a nonlinear manner. Accordingly, employing shapes for the adjustment film 236 that match the displacement of the vibrating portion 210 as illustrated in FIGS. 10 and 11 makes it possible to adjust the resonant frequency more efficiently. It is noted that the adjustment film 236 is not segmented in the lengthwise direction of the vibrating portion 210 in the configuration illustrated in FIG. 11, which makes it possible to increase the close contact strength of the adjustment film 236.

Figure 12A:
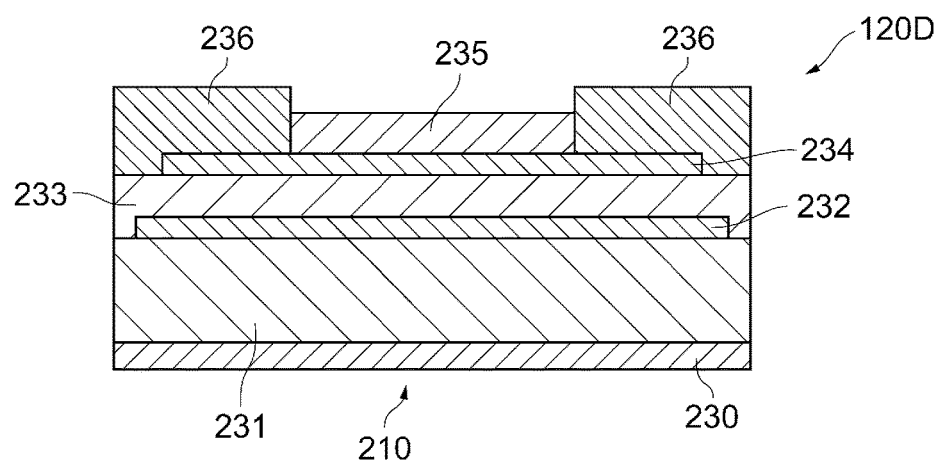
FIG. 12A is a schematic diagram illustrating a cross-section of a piezoelectric vibrator 120D serving as another example of the piezoelectric vibrator 120.
Figure 12B:
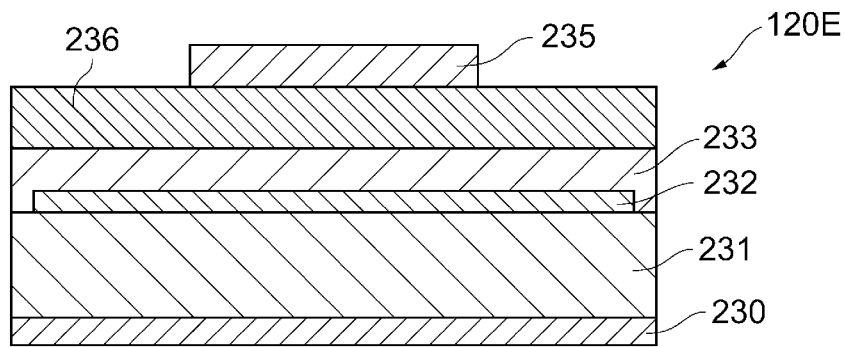
FIG. 12B is a schematic diagram illustrating a cross-section of a piezoelectric vibrator 120E serving as another example of the piezoelectric vibrator 120.
Figure 12C:
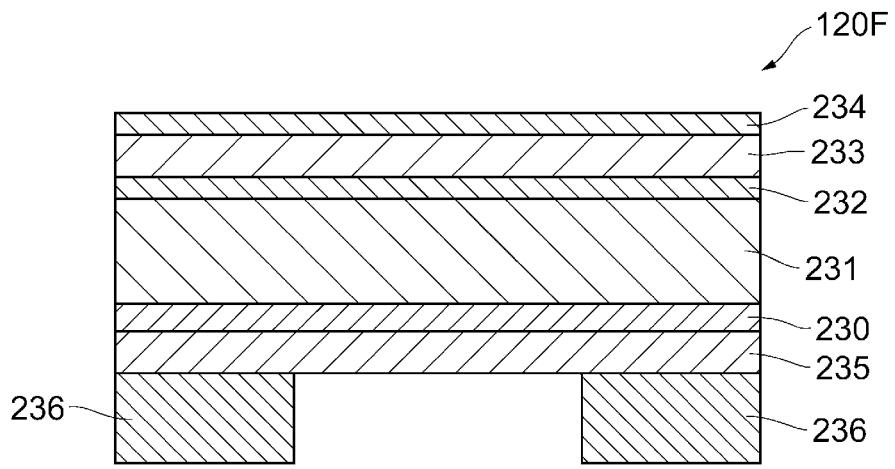
FIG. 12C is a schematic diagram illustrating a cross-section of a piezoelectric vibrator 120F serving as another example of the piezoelectric vibrator 120.

FIGS. 12A to 12C are schematic diagrams illustrating cross-sections of piezoelectric vibrators 120D to 120F, respectively, serving as other examples of the piezoelectric vibrator 120. The same constituent elements as those in the piezoelectric vibrator 120A will be given the same reference numerals, and descriptions thereof will be omitted.

In the piezoelectric vibrator 120D illustrated in FIG. 12A, the adjustment film 235 is formed so as to cover only part of the upper electrode 234 of the vibrating portion 210 rather than the entire surface of the upper electrode 234. Meanwhile, in the piezoelectric vibrator 120E illustrated in FIG. 12B, the adjustment film 236 is formed so as to cover the entire surface of the piezoelectric film 233 of the vibrating portion 210, and the adjustment film 235 is formed on part of the surface of the adjustment film 236. It is noted that the piezoelectric vibrator 120E does not have the upper electrode 234, and the adjustment film 236 functions as an upper electrode. Meanwhile, in the piezoelectric vibrator 120F illustrated in FIG. 12C, the adjustment film 235 and the adjustment film 236 are formed opposing a surface of the piezoelectric film 233 that faces the lower electrode 232 (a first surface).

In this manner, the adjustment films 235 and 236 may be formed so that almost the entire upper or lower surface of the vibrating portion 210 is covered and the displacement in the regions where the adjustment film 236 is exposed is greater than the displacement in the regions where the adjustment film 235 is exposed.

The manufacturing process can be simplified by using the adjustment film 236 as the upper electrode as illustrated in FIG. 12B. This also makes it possible to prevent the adjustment film 236 from peeling from the upper electrode.

Meanwhile, forming the adjustment films 235 and 236 so as to oppose the surface of the piezoelectric film 233 that faces the lower electrode 232 as illustrated in FIG. 12C makes it possible to prevent the piezoelectric film 233 from being etched in the case where the adjustment films 235 and 236 have been etched excessively.

FIG. 13 is a diagram illustrating the configuration of a piezoelectric vibrator 120G serving as another example of the piezoelectric vibrator 120. Note that the same elements as those in the piezoelectric vibrator 120A will be given the same reference numerals, and descriptions thereof will be omitted. The piezoelectric vibrator 120G is formed by linking vibrating portions 210A to 210E, which have the same configuration as the vibrating portion 210 of the piezoelectric vibrator 120A. In the piezoelectric vibrator 120G, adjacent vibrating portions vibrate by mutually-opposite phases, and thus the piezoelectric vibrator as a whole vibrates with contour vibrations. In this piezoelectric vibrator 120G as well, forming the adjustment films 235 and 236 in the same manner as in the piezoelectric vibrator 120A makes it possible to adjust the resonant frequency efficiently.

Figure 14A:
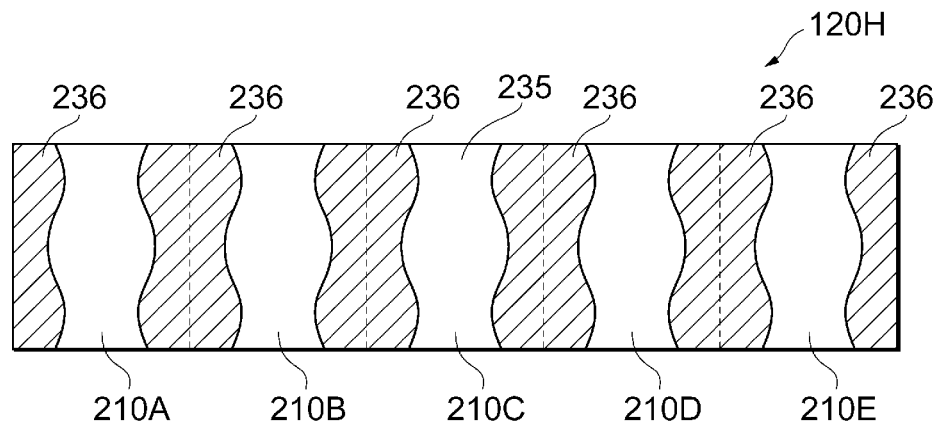
FIG. 14A is a diagram illustrating the configuration of a piezoelectric vibrator 120H serving as another example of the piezoelectric vibrator 120.
Figure 14B:
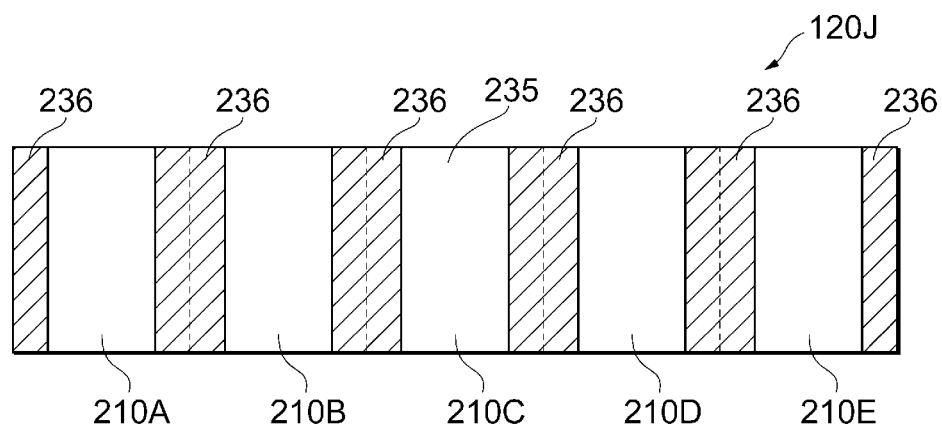
FIG. 14B is a diagram illustrating the configuration of a piezoelectric vibrator 120J serving as another example of the piezoelectric vibrator 120.
Figure 14C:
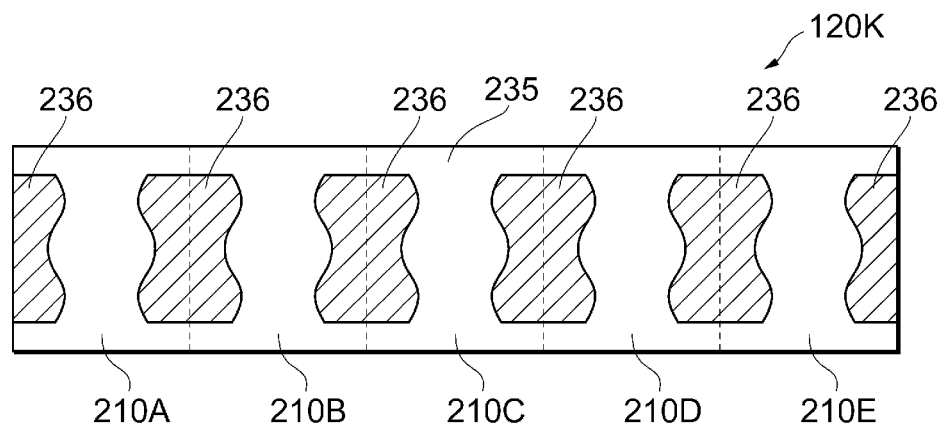
FIG. 14C is a diagram illustrating the configuration of a piezoelectric vibrator 120K serving as another example of the piezoelectric vibrator 120.

The arrangement of the adjustment film 236 illustrated in FIG. 13 is merely an example, and the arrangement is not limited thereto. FIGS. 14A, 14B, and 14C illustrate other examples of the arrangement of the adjustment film 236. In FIGS. 14A, 14B, and 14C, the adjustment film 236 is formed so as to be continuous in a short side direction of the piezoelectric vibrators 120 (120H, 120J, and 120K). Forming the adjustment films 235 and 236 in this manner makes it possible to adjust the resonant frequency efficiently. Note that the holding portion 200 illustrated in FIG. 13 is not illustrated in FIGS. 14A, 14B, and 14C for the sake of simplicity.

In the piezoelectric vibrator 120K illustrated in FIG. 14C, the conductive adjustment film 236 is formed so that end portions thereof are located further inward than an outer peripheral portion of the vibrating portion 210. This makes it possible to suppress a degradation of characteristics caused by the adjustment film 236 shorting with the upper electrode or the lower electrode at the outer peripheral portion of the vibrating portion 210.

Figure 15A:
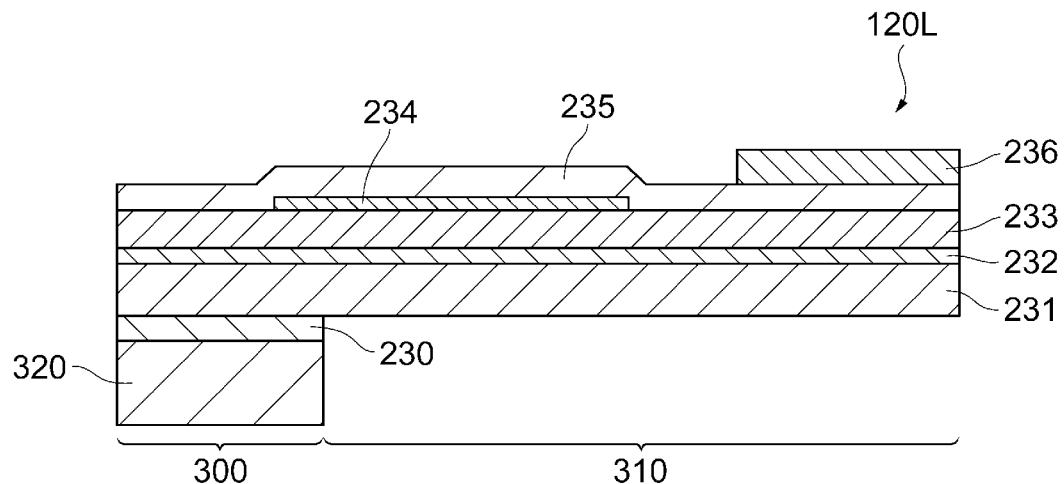
FIG. 15A is a diagram illustrating a cross-section of a piezoelectric vibrator 120L serving as another example of the piezoelectric vibrator 120.

FIG. 15A is a diagram illustrating a cross-section of a piezoelectric vibrator 120L serving as another example of the piezoelectric vibrator 120. Note that the same elements as those in the piezoelectric vibrator 120A will be given the same reference numerals, and descriptions thereof will be omitted. The piezoelectric vibrator 120L is a flexural vibration-type vibrator having a plurality of vibrating arms. FIG. 15A illustrates a cross-section of a single vibrating arm. The piezoelectric vibrator 120L has a base portion 300 and vibrating arms 310. The base portion 300 is constituted of silicon 320, SiO₂ 230, the silicon layer 231, the lower electrode 232, the piezoelectric film 233, the upper electrode 234, and the adjustment film 235. Aside from the silicon 320, a laminate structure of the base portion 300 and the vibrating arms 310 is the same as that of the piezoelectric vibrator 120A, and thus descriptions thereof will be omitted. In this piezoelectric vibrator 120L, the vicinities of tip portions of the vibrating arms 310 are regions of comparatively large displacement. As such, the adjustment films 235 and 236 are formed on the upper surface side of the piezoelectric vibrator 120L so that the adjustment film 236 is exposed in the vicinities of the tip portions of the vibrating arms 310 and the adjustment film 235 is exposed in other regions. As shown, the adjustment films 235 and 236 cover almost the entirety of the upper surface of the piezoelectric vibrator 120L.

Figure 15B:
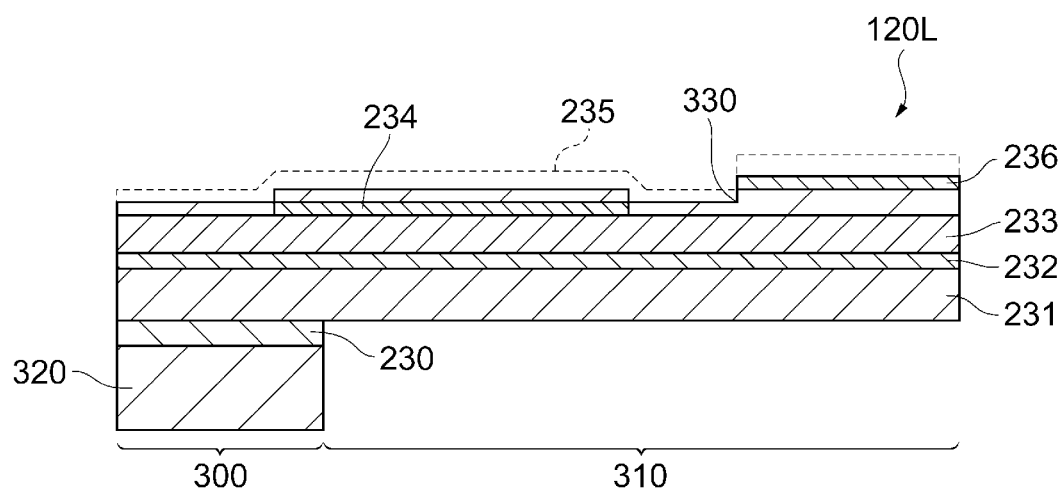
FIG. 15B is a schematic diagram illustrating a cross-section of the piezoelectric vibrator 120L after resonant frequency adjustment.

In the piezoelectric vibrator 120L, the adjustment films 235 and 236 are etched by irradiating the adjustment films 235 and 236 simultaneously with an ion beam, as indicated in FIG. 15B. This makes it possible to adjust the resonant frequency efficiently, in the same manner as the piezoelectric vibrator 120A.

In the piezoelectric vibrator 120L, a non-planarity is formed in the adjustment film 235 at a border 330 between the adjustment films 235 and 236, as illustrated in FIG. 15B. This makes it possible to suppress the adjustment film 236 from peeling away due to stress arising at the border 330 when the vibrating arms 310 vibrate with flexural vibrations.

It is noted that the state in which the adjustment films 235 and 236 are formed in a flexural-type vibrator is not limited to that illustrated in FIG. 15A. A variety of formation states can be employed, such as those illustrated in FIGS. 12A to 12C, for example.

The foregoing disclosure has described exemplary embodiments. In the respective embodiments, the adjustment films 235 and 236 are formed opposing the first surface of the piezoelectric film 233. The first surface is almost entirely covered by the adjustment films 235 and 236. Additionally, the region where the adjustment film 236 is exposed has a greater displacement when the piezoelectric vibrator 120 vibrates than the region where the adjustment film 235 is exposed. Furthermore, the adjustment film 236 has a higher mass reduction rate of etching than the adjustment film 235. According to the piezoelectric vibrator 120 configured in this manner, when the adjustment films 235 and 236 are etched simultaneously, the adjustment film 236 undergoes a comparatively greater level of mass reduction, which makes it possible to adjust the resonant frequency efficiently.

Additionally, because the first surface is almost entirely covered by the adjustment films 235 and 236, regions of the vibrating portion 210 aside from the adjustment films 235 and 236 can be prevented from being removed by the etching.

Additionally, in the contour vibration-type piezoelectric vibrator 120A, forming the stated adjustment films 235 and 236 makes it possible to adjust the resonant frequency efficiently.

Additionally, setting the exposed surface area of the adjustment film 236 to greater than or equal to approximately 30% and less than or equal to approximately 50% of the stated surface makes it possible to adjust the resonant frequency efficiently and suppress a change in the resonant frequency temperature characteristics.

Additionally, setting the exposed surface area of the adjustment film 236 to greater than or equal to approximately 10% and less than or equal to approximately 30% of the stated surface makes it possible to adjust the resonant frequency while keeping a change in the resonant frequency temperature characteristics extremely low.

Additionally, in the flexural vibration-type piezoelectric vibrator 120L, forming the stated adjustment films 235 and 236 makes it possible to adjust the resonant frequency efficiently.

The embodiments described above are intended to facilitate understanding of the present invention, and are not to be interpreted as limiting the present invention. The present invention can be modified/improved without departing from the essential spirit thereof, and thus all such variations and modifications also fall within the scope of the present invention. In other words, design changes added as desired to the embodiments by one skilled in the art also fall within the scope of the present invention as long as the features of the present invention are provided. For example, the elements provided in the embodiments, and the arrangements, materials, conditions, shapes, sizes, and so on thereof, are not limited to the examples given here, and can be changed as desired. Additionally, the elements provided in the embodiments can be combined as long as doing so is feasible from a technical standpoint, and such combinations also fall within the scope of the present invention as long as the features of the present invention are provided.

REFERENCE SIGNS LIST

100 PIEZOELECTRIC VIBRATING APPARATUS
110 SUBSTRATE
120 PIEZOELECTRIC VIBRATOR
130 COVER MEMBER
140 OUTER ELECTRODE
200 HOLDING PORTION
210 VIBRATING PORTION
220 HOLDING ARM
230 SILICON OXIDANT LAYER
231 SILICON LAYER
232 LOWER ELECTRODE
233 PIEZOELECTRIC FILM
234 UPPER ELECTRODE
235, 236 ADJUSTMENT FILM
300 BASE PORTION
310 VIBRATING ARM

The invention claimed is:

1. A piezoelectric vibrator comprising:
   a piezoelectric film having first and second surfaces that oppose each other;
   a first electrode opposing the first surface of the piezoelectric film;
   a second electrode opposing the second surface of the piezoelectric film;
   a first adjustment film disposed above a first region of the piezoelectric film with the first electrode interposed between the first adjustment film and the piezoelectric film; and
   a second adjustment film disposed above only a portion of the first adjustment film in a direction normal to the first surface of the piezoelectric film, such that the second adjustment film covers a second region of the piezoelectric film that is different from the first region of the piezoelectric film,
   wherein the second region of the piezoelectric film has a greater displacement than the first region of the piezoelectric film when the piezoelectric vibrator vibrates.

2. The piezoelectric vibrator according to claim 1, wherein the second adjustment film comprises a material having a higher mass reduction rate of etching than a material of the first adjustment film.

3. The piezoelectric vibrator according to claim 1, wherein the first region of the piezoelectric film comprises all of the first surface of the piezoelectric film.

4. The piezoelectric vibrator according to claim 1, wherein the first electrode, the second electrode, and the piezoelectric film form a rectangular vibrating portion that vibrates with contour vibrations.

5. The piezoelectric vibrator according to claim 4, wherein the second region corresponds to four corners of the vibrating portion.

6. The piezoelectric vibrator according to claim 5, wherein the second region corresponding to the four corners of the vibrating portion comprises four separate regions that each comprise a rectangle shape.

7. The piezoelectric vibrator according to claim 4, further comprising:
   a rectangular frame; and
   a pair of holding arms configured to hold the rectangular vibrating portion within the rectangular frame on opposing sides of the rectangular vibrating portion.

8. The piezoelectric vibrator according to claim 4, wherein the second region has a surface area that is greater than or equal to 10% and less than or equal to 50% of a surface area of the first surface of the piezoelectric film.

9. The piezoelectric vibrator according to claim 8, wherein the surface area of the second region is greater than or equal to 30% and less than or equal to 50% of the surface area of the first surface of the piezoelectric film.

10. The piezoelectric vibrator according to claim 8, wherein the surface area of the second region is greater than or equal to 10% and less than or equal to 30% of the surface area of the first surface of the piezoelectric film.

11. The piezoelectric vibrator according to claim 1, wherein the first electrode, the second electrode, and the piezoelectric film form a vibrating arm that vibrates with flexural vibrations; and
    wherein the second region corresponds to a tip portion of the vibrating arm.

12. The piezoelectric vibrator according to claim 1, wherein the second adjustment film is disposed on the first adjustment film and covers a plurality of portions of the first region of the piezoelectric film in a direction normal to the first surface of the piezoelectric film.

13. The piezoelectric vibrator according to claim 1, wherein the second adjustment film covering the second region of the piezoelectric film does not cover the first region of the piezoelectric film in a direction normal to the first surface of the piezoelectric film.

14. The piezoelectric vibrator according to claim 13, wherein at least portions of the first and second adjustment films are each respectively disposed directly on the first electrode.

15. The piezoelectric vibrator according to claim 1, wherein the first adjustment film is disposed directly on the first electrode and the second adjustment film is disposed directly on the first adjustment film.

16. A piezoelectric vibrating apparatus comprising:
    the piezoelectric vibrator according to claim 1;
    a cover member that covers the piezoelectric vibrator; and
    at least one outer electrode.

17. A piezoelectric vibrator comprising:
    a rectangular vibrating portion including a piezoelectric film and at least one electrode disposed on a surface of the piezoelectric film, respectively;
    a first adjustment film disposed above at least one of the first electrode and the piezoelectric film and covering a first region of the surface of the piezoelectric film; and
    a second adjustment film disposed above only a portion of the first adjustment film in a direction normal to the surface of the piezoelectric film, such that the second adjustment film covers a second region of the surface of the piezoelectric film wherein the second region corresponds to a second surface area of the surface of the piezoelectric film that is smaller than a first surface area of the surface of the first region,
    wherein the second region covers at least four corners of the vibrating portion.

18. The piezoelectric vibrator according to claim 17, wherein the second region of the surface of the piezoelectric film has a greater displacement than the first region when the piezoelectric vibrator vibrates.

19. The piezoelectric vibrator according to claim 17, wherein the second adjustment film comprises a material having a higher mass reduction rate of etching than a material of the first adjustment film.

20. The piezoelectric vibrator according to claim 17, wherein the second surface area greater than or equal to 10% and less than or equal to 50% of the first surface area.

* * * * *